United States Patent [19]

Sado et al.

[11] Patent Number: 4,520,562

[45] Date of Patent: Jun. 4, 1985

[54] METHOD FOR MANUFACTURING AN ELASTIC COMPOSITE BODY WITH METAL WIRES EMBEDDED THEREIN

[75] Inventors: Ryoichi Sado; Kazutoki Tahara, both of Saitama, Japan

[73] Assignee: Shin-Etsu Polymer Co., Ltd., Tokyo, Japan

[21] Appl. No.: 549,014

[22] Filed: Nov. 4, 1983

Related U.S. Application Data

[63] Continuation of Ser. No. 206,064, Nov. 12, 1980, abandoned.

[30] Foreign Application Priority Data

Nov. 20, 1979 [JP] Japan .................. 54-150369

[51] Int. Cl.³ .......................... H01R 43/02
[52] U.S. Cl. .................. 29/878; 174/117 F; 339/17 F
[58] Field of Search ............ 29/878, 883, 850; 156/299, 176, 179, 205–209; 174/35 GC, 117 F; 339/17 B, 17 E, 17 F

[56] References Cited

U.S. PATENT DOCUMENTS

| 3,082,292 | 3/1963 | Gore . | |
| 3,126,440 | 3/1964 | Goodloe | 174/35 GC |
| 3,462,542 | 8/1969 | Richter . | |
| 3,530,033 | 9/1970 | Hildebrandt | 156/299 X |
| 3,539,967 | 11/1970 | Clements . | |
| 3,708,871 | 1/1973 | Mintz . | |
| 3,795,037 | 3/1974 | Luttmer . | |
| 3,923,364 | 12/1975 | Shapiro et al. . | |
| 4,149,026 | 4/1979 | Fritz et al. . | |
| 4,228,209 | 10/1980 | Chavannes . | |
| 4,232,074 | 11/1980 | Chavannes . | |

Primary Examiner—Howard N. Goldberg
Assistant Examiner—Carl J. Arbes
Attorney, Agent, or Firm—Hopgood, Calimafde, Kalil, Blaustein & Judlowe

[57] ABSTRACT

The invention provides a novel and improved method for manufacturing an elongated piece of a composite body composed of a rubber or plastic body of an elongated form and a plurality of electroconductive linear bodies embedded in or bonded on the surface of the elongated rubber or plastic body in alignment, each of the linear bodies extending in the transverse direction of the elongated body in substantial parallelism with each other and being in a curved, bent or corrugated form useful as a connector, electromagnetic shielding gasket and the like. Different from conventional known methods, the invention proposes a method in which the linear bodies are first integrated with the sheet of rubber or plastic followed by corrugating the linear bodies together with the sheet and chopping of the thus corrugated composite body into pieces in a plane perpendicular to the longitudinal direction of the linear bodies.

1 Claim, 21 Drawing Figures

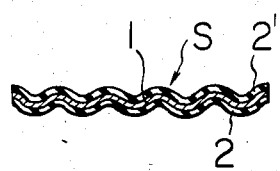
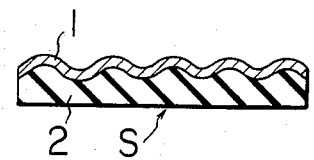
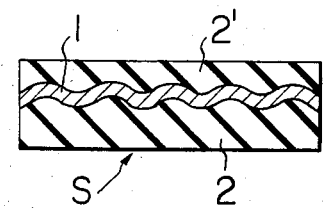
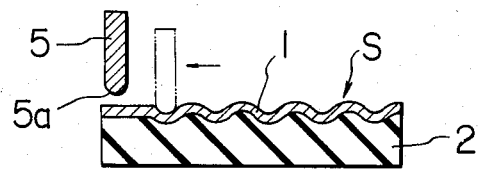
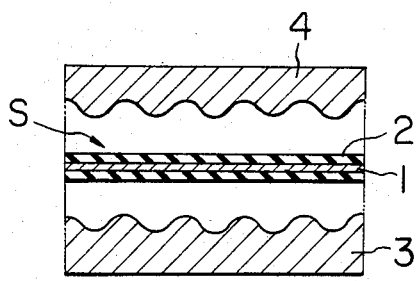
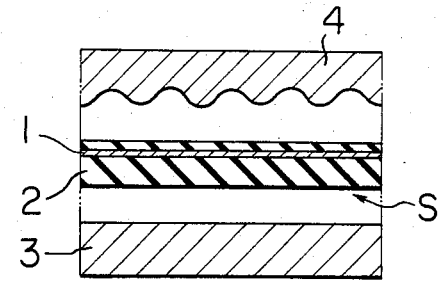

METHOD FOR MANUFACTURING AN ELASTIC COMPOSITE BODY WITH METAL WIRES EMBEDDED THEREIN

This application is a continuation of application Ser. No. 206,064, filed Nov. 12, 1980, now abandoned.

BACKGROUND OF THE INVENTION

The present invention relates to a method for manufacturing an elastic composite body with a plurality of metal wires embedded therein or bonded thereon in alignment so as to impart anisotropic electroconductivity to the body, which is useful as a connector for electrically connecting two electronic circuit boards, electromagnetic shielding gasket, thermally conductive gasket and the like.

There have been widely used in the art in the above mentioned applications a variety of elongated rod-like composite bodies composed of an elastomer or a plastic body and a plurality of metal wires each extending in the transverse direction of the elongated body in substantially parallel alignment with each other as embedded therein or bonded on the surface so as that the elongated body is imparted with electroconductivity in the transverse direction but insulating in the longitudinal direction.

Basically and most simply, each of the metal wires in or on the elongated body can be in a straightened form in order that the composite body is most conveniently manufactured. Recently, there are proposed composite bodies of the kind in which each of the metal wires embedded in or bonded on the surface of the elongated body of rubber or plastic is curved, bent or corrugated in a wavy form (see, for example, U.S. Pat. Nos. 3,708,871 and 3,795,037 and Japanese Patent Disclosure No. 48-91580) which is the equivalent to U.S. Pat. No. 3,852,878. The composite bodies with such curved, bent or corrugated metal wires are advantageous in the increased elastic resilience when the composite body is under compression in the direction parallel to the longitudinal direction of the aligned metal wires by virtue of the resilience caused by the elastic deformation of the metal wires supplementing the elasticity of the rubber or plastic matrix.

The composite bodies with curved, bent or corrugated metal wires are manufactured in a variety of procedures as is known from the above mentioned prior art references. In any way, however, the metal wires or ribbons are in advance deformed and shaped to have a desired curved, bent or corrugated form and the thus deformed metal wires are then integrated with the rubber or plastic matrix material to be embedded therein or bonded thereon. Such a manufacturing procedure is, however, somewhat defective due to the difficulty in obtaining satisfactory uniformity or exactness of the alignment of the metal wires. For example, curved or bent wires can not always be in exact parallelism with each other and corrugated wires have no satisfactory conformability with respect to the phase of the corrugated waves in or on the elongated body.

The above mentioned irregularity in the alignment of the metal wires naturally leads to the localized irregularity of the resilience of the composite body as a whole so that an unduly larger compressive force is required for holding the composite body with compression in a narrow space between two holding planes than otherwise. In addition, some of the metal wires receive an excessively large compressive force over others so that they are increasingly subject to elastic fatigue with dereased reproducibility in the contacting condition which is undesirable from the standpoint of obtaining constant electroconductivity performance with constant compressive load in the repeated use of the composite body.

The manufacturing procedures disclosed in the latter two of the above mentioned prior art references are relatively free from the above described problem of the irregularity in the alignement of the metal wires. These procedures are, however, very complicated and troublesome with rather low yield of the products so that defective from the standpoint of practical production.

SUMMARY OF THE INVENTION

An object of the present invention is therefore to provide a novel and improved method free from the above described problems in the prior art methods for manufacturing a composite body of an elongated form composed of a rubber or plastic material and a plurality of linear bodies, e.g. wires or ribbons, of a metal embedded in or bonded on the surface of the elongated body in alignment, each extending in the transverse direction of the elongated body in substantial parallelism with each other and each being in a curved, bent or corrugated form.

The method of the present invention for manufacturing the above described composite body comprises the steps of (a) integrating a plurality of straight linear bodies, e.g. wires, of an electrically conductive material, e.g. metal, with a sheet of a rubber or a plastic into a composite body, the linear bodies being embedded in or bonded on the surface of the sheet and lying on at least one plane parallel to the surface of the sheet with substantial parallelism with each other extending in the same direction, and (b) a combination of the two steps of (b-1) plastically deforming the linear bodies in corrugation with regular pitch together with the sheet, and (b-2) chopping the composite body in a plane perpendicular to the longitudinal direction of the linear bodies.

The sequential order of the above mentioned steps (b-1) and (b-2) is not limitative but, preferably, the step (b-1) is succeeded by the step (b-2).

BRIEF DESCRIPTION OF THE DRAWING

FIGS. 3a to 3c are each a cross sectional view of the corrugated composite body before chopping.

FIG. 4 illustrates a principle of corrugating with a presser plate.

FIGS. 5a and 5b illustrate the corrugating process with a metal mold having a corrugated molding surface or surfaces.

DETAILED DESCRIPTION OF THE PREFERRED EMBODIMENTS

Figure 1A:
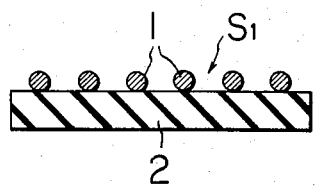
FIGS. 1a to 1d are each a cross sectional view of the composite body before corrugation as cut in a plane perpendicular to the longitudinal direction of the straight wires.

The method of the present invention is now described in detail with reference to the accompanying drawing.

The first step of the inventive method is integration of a sheet made of a rubber or a plastic with a plurality of electrically conductive linear bodies, typically, metal wires. The rubbers and plastics suitable in the invention are not particularly limited and any kinds of synthetic and natural rubbers and thermoplastic resins can be used. The thickness and other dimensions of the sheet are also determined according to need for the particularly desired composite bodies. It is sometimes advantageous to use a continuous length sheet of the rubber or plastic which may be integrated with the metal wires in a continuous process. The rubber may be either before curing or after complete curing. The sheet materials may contain various kinds of conventional additive ingredients such as curing or vulcanizing agents, reinforcing or extending fillers, stabilizers, plasticizers, coloring agents, lubricants, softening agents, coupling agents, foaming agents, thermal conductivity-imparting agents, electroconductivity-imparting agents, heat resistance improvers and the like according to particular needs.

The electrically conductive linear bodies to be integrated with the sheet material are wires or ribbons made of, for example, a metal such as iron, nickel, copper, tin, aluminum, zinc, gold, silver, palladium, tungsten, titanium and the like as well as alloys of these metals such as stainless steel, phosphor bronze, nickel silver, silver-palladium alloys and the like though not limited to metals and alloys including other kinds of conductive materials such as carbon filaments and silicon carbide filaments.

The cross sectional forms and dimensions of the metal wires are also not particularly limitative but the cross section is usually circular, elliptical, square or rectangular. When the linear body is a wire of a circular cross section, the diameter is in the range from 1 $\mu$m to 3 mm and, when the wire has a rectangular cross section, the thickness is in the range from 1 $\mu$m to 3 mm and the width is in the range from 1 $\mu$m to 5 mm.

The step of integrating the sheet material and the linear bodies can be carried out in a variety of methods by use of a warping machine or by the method in which the wire is continuously wound around the sheet material cylindrically covering a drum in a regular pitch with subsequent cutting of the cylindrical sheet into a plane together with the wires. It is also convenient to use a method of simultaneous extrusion of the rubber or plastic with the warped wires though not applicable to ready-cured rubbers. When the wires are to be bonded on to the surface of the sheet, it is preferable to use an adhesive agent so as that firmness of integration is ensured.

In any way, the integrated composite body composed of the sheet material and a plurality of straight wires embedded therein or bonded on the surface thereof has a cross section as cut perpendicularly to the straight wires as depicted in either one of FIGS. 1a to 1d.

FIG. 1a illustrates a cross section of a composite body S in which the metal wires 1 are bonded on just the surface of the rubber or plastic sheet 2 by the aid of an adhesive agent. In the composite body S depicted in FIG. 1b, the metal wires 1 are partly embedded in the sheet 2 to a depth of a half of the diameter of the wires 1. The composite bodies S in FIGS. 1c and 1d have the metal wires 1 completely embedded in the sheet 2 with the plane of the wire alignment positioned near to one of the surfaces of the sheet 2 in the former and at about equal distances from the surfaces of the sheet 2 in the latter.

In the composite bodies S illustrated in FIGS. 1a to 1d, all of the metal wires 1 are aligned on one and the same plane on or in the sheet 2. It is also possible that the metal wires 1 are aligned on two or more planes, usually, in parallel with each other. Examples of such a two-layer alignment of the metal wires 1 are illustrated in FIGS. 2a to 2c by the cross sections of the composite bodies S. The positions of the wire alignment planes can be varied according to need as is shown in the figures, of which both of the planes are on the surfaces of the sheet 2 in FIG. 1a, one on the surface and the other within the sheet 2 in FIG. 2b and both within the sheet 2 in FIG. 2c. Although the number of the wire alignment planes is not limited to one or two, difficulties are encountered in the subsequent step of wire corrugation when the wires are aligned on three or more planes so that it is not recommended to have more than three alignment planes.

When the sheet 2 used in the above described step (a) of the inventive method is made of an uncured rubber, it is preferable that the uncured rubber is cured or, at least semicured simultaneously with or directly after integration of the metal wires 1 with the sheet 2 into the composite body S in order to facilitate handling of the body in the suceeding steps. It is sometimes advantageous to apply a coupling agent or a primer to the surface of the wires 1 or on the surface of the sheet 2 to improve the adhesive bonding between the wires 1 and the sheet 2.

The next step is the step (b-1) for corrugating the metal wires into a wavy form with a regular pitch. The composite body S with the thus corrugated wires 1 has a cross section as shown, for example, in FIGS. 3a or 3b as cut in a plane parallel to the longitudinal direction of the wires 1. The corrugated composite bodies S shown in FIG. 3a and in FIG 3b are obtained with the composite bodies S shown in FIGS. 1d and 1a, respectively. When the surface of the composite body S with the corrugated wires 1 is desired to be flat, the corrugated surface of the composite body S of, for example, FIG. 3b is provided with an overlay 2' of a rubber so as that both of the surfaces of the composite body S may be flat as is shown in FIG. 3c.

The procedure of corrugating is rather conventional. In principle, corrugation is performed, as is shown in FIG. 4, by pressing the surface of the composite body S supporting the straight wires 1 with a presser plate 5 having a rounded end 5a in conformity with the desired form of the waves one by one so as that metal wires are plastically deformed and corrugated into a wavy form. Difficulties are unavoidable, however, in this simple method when uniformity in the pitch of the waves is essential.

When more uniform or regular corrugation is desired in the composite body S with the corrugated wires 1, it is preferable to use a pair of metal molds of which at least one has a corrugated molding surface. FIG. 5a illustrates an example of such a set of metal molds of which both of the lower mold 3 and the upper mold 4 have corrugated molding surfaces to be coupled together with the composite body S therebetween producing a corrugated composite body as shown in FIG. 3a. FIG. 5b illustrates another set of metal molds composed of a lower mold 3 having a flat molding surface and an upper mold 4 having a corrugated molding surface. The composite body S shaped with this set of metal molds naturally has a flat bottom surface and a corrugated top surface.

It is also conventional and convenient to use a pair of corrugating rollers similar to those used in the manufacture of corrugated cardboard, especially, when the composite body to be corrugated is a continuous length one.

It is also possible that the uncured rubber forming the composite body is cured simultaneously with this corrugating step. In any way, the thus corrugated and cured composite body is subjected to a post-heat treatment in order to remove any undesirable stress caused by the corrugation.

The last step (b-2) is chopping of the thus obtained composite body S in a plane perpendicular to the longitudinal direction of the corrugated wires 1 into rod-like extended pieces. The width h of the thus chopped pieces is preferably equal to at least one quarter of the wavelength or, more preferably, at least one wavelength of the corrugation in order that the thus obtained piece of the composite body has a sufficient resilience when compressed in the longitudinal direction of the corrugated wires. In other words, the corrugation of the wires should be so fine that at least a quarter of the wavelength or at least one wavelength of the corrusated wires is included in each of the chopped pieces.

Figure 1B:
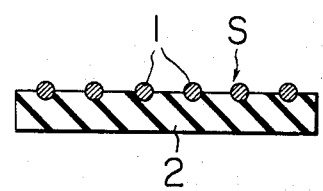
Figure 1C:
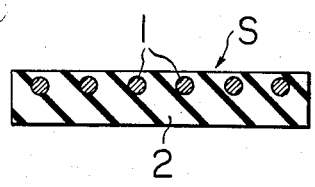
Figure 1D:
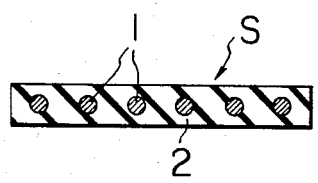
Figure 2A:
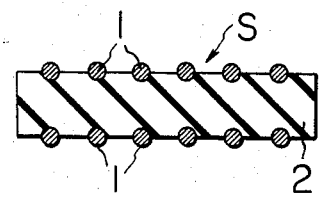
FIGS. 2a to 2c are each a cross sectional view of a similar composite body to those in FIGS. 1a to 1d, in which the wires are aligned on two planes.
Figure 2B:
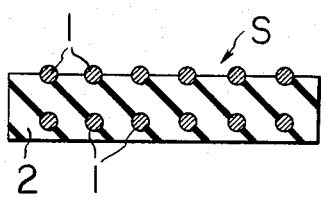
Figure 2C:
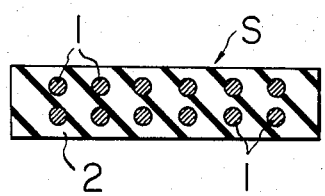
Figure 6A:
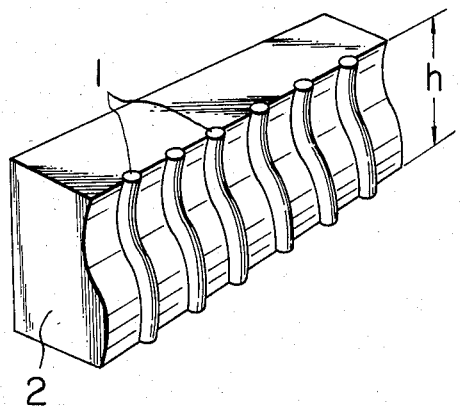
FIGS. 6a to 6d are each a perspective view of a piece of the composite body of the invention.
Figure 6B:
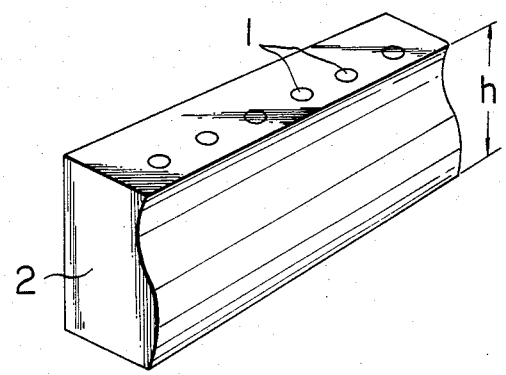
Figure 6C:
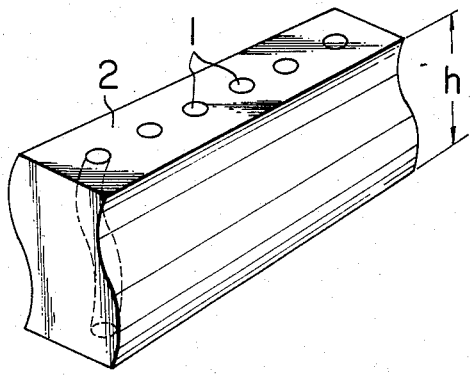
Figure 6D:
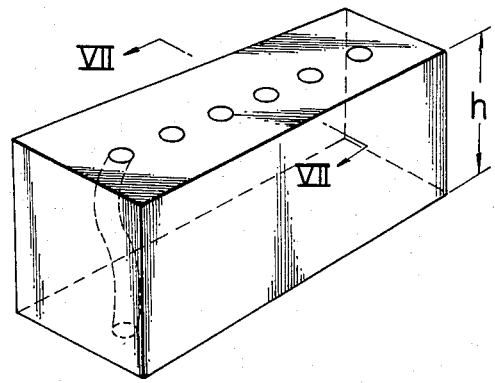
Figure 7:
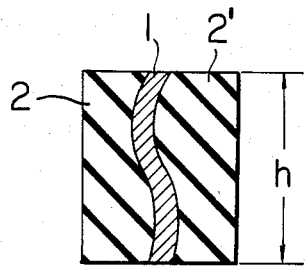
FIG. 7 is a cross sectional view of the piece shown in FIG. 6d.

FIGS. 6a and 6c each illustrate a perspective view of the chopped piece of the composite body with corrugated wires as obtained with the composite bodies S shown in FIGS. 1b, 1c and 1d, respectively. Further, FIG. 6d illustrates a perspective view of the chopped piece of the composite body having flat surfaces parallel to the wire alignment plane as obtained from the composite body S shown in FIG. 3c with an overlay on the corrugated surface. FIG. 7 is a cross sectional view of such a piece with flat surfaces as cut in a plane including one of the corrugated wires as viewed in the direction shown by the arrows VII—VII in FIG. 6d.

Figure 8A:
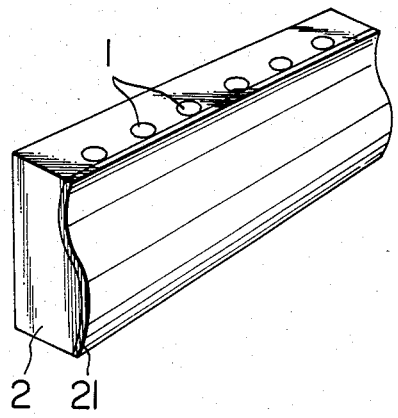
FIGS. 8a and 8b are each a perspective view of a piece of the inventive composite body in which the wires are supported with a plastic sheet.
Figure 8B:
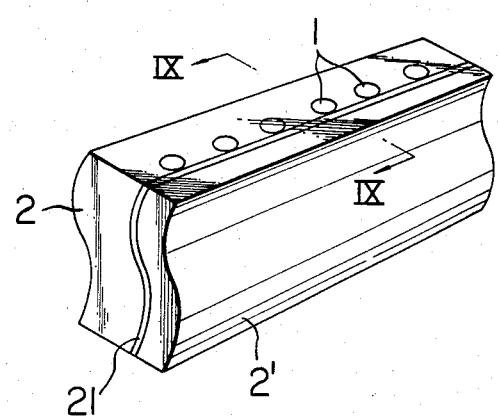
Figure 9:
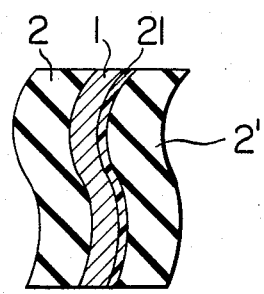
FIG. 9 is a cross sectional view of the piece shown in FIG. 8b.

Though within the scope of the present invention, FIGS. 8a and 8b illustrate perspective views of somewhat different modifications of the pieces of the composite bodies. In preparing the piece of FIG. 8a, the wires 1 are first adhesively bonded to the surface of a plastic sheet 21 in alignment in a similar manner to that shown in FIG. 1a by the cross section. Then the array of the wires 1 is covered with a sheet 2 of an uncured rubber and integrated into a single composite body followed by corrugating the wires 1 and chopping of the composite body with simultaneous curing of the uncured rubber to give the piece shown in FIG. 8a. The piece of the composite body shown in FIG. 8b differs from that in FIG. 8a only in that it is provided with a rubber overlay 2' also on the back surface of the plastic sheet 21. FIG. 9 illustrates a cross sectional view of the piece shown in FIG. 8b as cut in a plane including one of the corrugated wires and viewed in the direction shown by the arrows IX—IX in FIG. 8b. The advantage obtained by use of such a plastic sheet 21 is the increased exactness of the alignment of the wires in comparison with the procedures in which the wires 1 are first bonded to a rubber sheet which is relatively labile in forms.

What is claimed is:

1. A method for manufacturing an elongated piece of a composite body composed of a polymeric body of an elongated form and a plurality of linear bodies of an electroconductive material embedded in the elongated body in alignment, each of the linear bodies extending in the transverse direction of the elongated body in substantial parallelism with each other and being in a form, which comprises the steps of
(a) integrally bonding a plurality of straight linear bodies of an electroconductive material on at least one of the surfaces of a polymeric sheet in alignment and substantial parallelism with each other,
(b) plastically deforming the linear bodies in corrugation with a regular pitch together with the plastic sheet,
(c) integrally providing a layer of a rubber overlying the array of the corrugated linear bodies to give an integrated composite body, and
(d) cutting the integrated composite body in a plane perpendicular to the longitudinal direction of the linear bodies about a single pitch of corrugation to provide a composite body having a single pitch of corrugation and two oppositely facing substantially parallel contacting end surfaces.

* * * * *